(12) United States Patent
Nakayama

(10) Patent No.: US 8,011,987 B2
(45) Date of Patent: Sep. 6, 2011

(54) ORGANIC EL DEVICE AND ITS MANUFACTURE METHOD

(75) Inventor: Masaya Nakayama, Kawasaki (JP)

(73) Assignee: Fuji Photo Film Co., Ltd., Ashigara-shi, Kanagawa (JP)

( * ) Notice: Subject to any disclaimer, the term of this patent is extended or adjusted under 35 U.S.C. 154(b) by 433 days.

(21) Appl. No.: 11/526,709

(22) Filed: Sep. 26, 2006

(65) Prior Publication Data

US 2007/0031588 A1 Feb. 8, 2007

Related U.S. Application Data

(60) Division of application No. 11/043,963, filed on Jan. 28, 2005, now Pat. No. 7,129,637, which is a continuation of application No. PCT/JP03/01892, filed on Feb. 20, 2003.

(51) Int. Cl.
*H01J 9/26* (2006.01)

(52) U.S. Cl. .......................... 445/25; 313/504

(58) Field of Classification Search ........... 313/498–512
See application file for complete search history.

(56) References Cited

U.S. PATENT DOCUMENTS

| | | | |
|---|---|---|---|
| 5,368,991 A | 11/1994 | Uchikawa et al. | |
| 6,246,179 B1 | 6/2001 | Yamada | |
| 6,597,121 B2 | 7/2003 | Imura | |
| 6,624,567 B2 * | 9/2003 | Nagayama et al. | 313/503 |
| 6,683,410 B2 * | 1/2004 | Hitoshi | 313/506 |
| 6,911,774 B2 | 6/2005 | Arakawa et al. | |
| 2002/0057051 A1 | 5/2002 | Kobayashi | |
| 2002/0079494 A1 | 6/2002 | Kim et al. | |
| 2002/0079503 A1 | 6/2002 | Yamazaki et al. | |
| 2002/0140343 A1 | 10/2002 | Hirabayashi | |
| 2002/0158835 A1 * | 10/2002 | Kobayashi et al. | 345/100 |
| 2003/0205708 A1 * | 11/2003 | Lee et al. | 257/72 |

FOREIGN PATENT DOCUMENTS

| | | |
|---|---|---|
| EP | 1006587 A2 | 6/2000 |
| JP | 04-181228 A | 6/1992 |
| JP | 11-024604 | 1/1999 |
| JP | 11-339573 | 12/1999 |

(Continued)

OTHER PUBLICATIONS

Japanese Notice of Reasons for Rejection dated Apr. 8, 2008 issued in corresponding Japanese Patent Application No. 2004-568489.

(Continued)

*Primary Examiner* — Anne M Hines
(74) *Attorney, Agent, or Firm* — Westerman, Hattori, Daniels & Adrian, LLP

(57) ABSTRACT

A TFT is formed on a substrate. TFT has first and second regions as a source and a drain, a channel region between the first and second regions, and a gate electrode. An interlayer insulating film is formed on the substrate, covering the thin film transistor. A pixel electrode disposed on the interlayer insulating film is electrically connected to the first region of TFT via a via hole formed in the interlayer insulating film. A cover film covers the edge of the pixel electrode, exposes the inner area of the pixel electrode, and covers the surface of the interlayer insulating film in the area superposed upon the channel region of the thin film transistor to shield an ultraviolet ray. An organic light emission layer and an upper electrode are disposed on and above the pixel electrode.

4 Claims, 6 Drawing Sheets

FOREIGN PATENT DOCUMENTS

| | | |
|---|---|---|
| JP | 2000-077190 | 3/2000 |
| JP | 2001-010217 A | 1/2001 |
| JP | 2001-56650 A | 2/2001 |
| JP | 2001-133807 A | 5/2001 |
| JP | 2001-160486 A | 6/2001 |
| JP | 2001-175200 A | 6/2001 |
| JP | 2001-223077 A | 8/2001 |
| JP | 2002-124381 A | 4/2002 |
| JP | 2002-278477 A | 9/2002 |
| JP | 2002-350833 A | 12/2002 |
| JP | 2003-017248 A | 1/2003 |
| JP | 2003-017249 A | 1/2003 |
| WO | WO 01/80319 A2 | 10/2001 |

OTHER PUBLICATIONS

International Search Report of PCT/JP03/01892 dated May 13, 2003.

European Search Report dated Aug. 2, 2007 Application No. 03705373.3-2003 PCT/JP0301892.

"Surface Modification of Indium Tin Oxide by Plasma Treatment: An Effective Method to Improve the Efficiency, Brightness, and Reliability of Organic Light Emitting Devices"; C.C. Wu, C.I. Wu, J. C. Sturm, and A. Kahn, Applied Physics Letters, AIP, American Institute of Physics, Melville, NY, US, vol. 70, No. 11, Mar. 17, 1997, pp. 1348-1350. XP012017410 ISSN: 0003-6951.

* cited by examiner

ORGANIC EL DEVICE AND ITS MANUFACTURE METHOD

CROSS REFERENCE TO RELATED APPLICATION

This application is a Divisional Application of Ser. No. 11/043,963 filed on Jan. 28, 2005 which is a Continuation Application of PCT/JP03/01892 filed on Feb. 20, 2003, the entire contents of which are incorporated herein by reference.

TECHNICAL FIELD

The present invention relates to an organic EL device and its manufacture method, and more particularly to an organic EL device having the structure that an organic light emission material layer and an upper electrode are stacked above pixel electrodes connected to thin film transistors.

BACKGROUND ART

A display apparatus using an organic electro luminescence (organic EL) device has been paid attention recently as a thin film light weight display apparatus to be replaced with cathode ray tubes (CRT) and liquid crystal display (LCD). Studies and developments are vigorously made on an organic EL display apparatus having thin film transistors as switching elements for driving the organic EL display apparatus, among other display apparatuses.

FIG. 6 is a cross sectional view of an organic EL device disclosed in Japanese Patent Laid-open Publication No. 2001-133807. On a transparent substrate 1 whose surface is covered with a silicon oxide film, a top gate type thin film transistor 10 is formed. The thin film transistor (TFT) 10 comprises first and second regions R1 and R2 as a source and a drain, a channel region C between the first and second regions R1 and R2, and a gate electrode G.

An intermediate connection metal 15 is formed on the first region R1 of TFT 10, and a data line 16 is connected to the second region R2. An interlayer insulating film 20 is formed covering TFT 10, intermediate connection metal 15 and data line 16. A transparent pixel electrode 25 made of indium tin oxide (ITO) is formed on the interlayer insulating film 20.

A cover film 26 disposed overlapping the outer periphery of the pixel electrode 25 covers the edge of the pixel electrode 25. An organic light emission layer 30 is formed on the pixel electrode 25 inside the cover film 26. The edge of the organic light emission layer 30 rides on the cover film 26. An upper electrode 35 is formed on the organic light emission layer 30 and interlayer insulating film 20. The cover film 26 prevents a short circuit between the pixel electrode 25 and upper electrode 35.

Photosensitive resist material is used as the material of the cover film 26. By using the photosensitive resist material, the cover film 26 can be patterned by three processes; resist material coating, exposing and development. If other insulating materials are used, additional processes are necessary including etching using a resist pattern and resist pattern removal. As the photosensitive resist is used as the material of the cover film 26, the manufacture processes can be simplified.

It is known that if the surface of an ITO film used as the anode of the organic EL device is forcibly oxidized prior to forming the organic light emission film, the characteristics of the organic EL device can be improved. As the forcible oxidation method, two methods are effective, oxidation using oxygen plasma and ultraviolet radiation in an ozone atmosphere.

If the photosensitive resist is used as the material of the cover film 26 shown in FIG. 6 and the pixel electrode 25 is exposed to oxygen plasma, the cover film 26 is etched. Therefore, ultraviolet radiation in an ozone atmosphere is preferable as the forcible oxidation method for the surface of the pixel electrode 25.

However, as an ultraviolet ray is radiated to the pixel electrode 25, the ultraviolet ray is radiated also to TFT 10. TFT 10 is damaged by the ultraviolet ray and its characteristics are degraded.

DISCLOSURE OF THE INVENTION

An object of the present invention is to provide an organic EL device whose TFT characteristics are hard to be degraded even if an ultraviolet ray is radiated to a pixel electrode.

According to one aspect of the present invention, there is provided an organic EL device comprising: first and second regions as a source and a drain formed above a substrate; a thin film transistor including a channel region between the first and second regions and a gate electrode; an interlayer insulating film disposed on the substrate, covering the thin film transistor; a pixel electrode disposed on the interlayer insulating film and electrically connected to the first region of the thin film transistor via a via hole formed the interlayer insulating film; a cover film covering an edge of the pixel electrode and not covering an inner area of the pixel electrode; a light shielding film for shielding an ultraviolet ray, the light shielding film covering a surface of the interlayer insulating film in an area superposed upon the channel region of the thin film transistor; an organic light emission film disposed on the pixel electrode and containing organic light emission material; and an upper electrode disposed on the organic light emission layer.

According to another aspect of the present invention, there is provided a manufacture method for an organic EL device comprising steps of: forming a thin film transistor above a principal surface of a substrate, the thin film transistor including first and second regions as a source and a drain, a channel region between the first and second regions and a gate electrode; forming an interlayer insulating film above the substrate, the interlayer insulating film covering the thin film transistor; forming a pixel electrode disposed on the interlayer insulating film, the pixel electrode being electrically connected to the first region of the thin film transistor; forming a cover film covering an edge of the pixel electrode, exposing an inner area of the pixel electrode, and covering a surface of the interlayer insulating film in an area superposed upon the channel region of the thin film transistor; irradiating an ultraviolet ray upon the substrate from a principal surface side of the substrate, while a surface of the pixel electrode is exposed to an oxidizing atmosphere; forming an organic light emission film on the pixel electrode, the organic light emission film containing organic light emission material; and forming an upper electrode on the organic light emission layer.

Since an ultraviolet ray radiated to the substrate is shielded with the light shielding film, the intensity of the ultraviolet ray reaching the channel region of TFT is weakened. It is therefore possible to prevent the TFT characteristics from being degraded.

BEST MODE FOR CARRYING OUT THE INVENTION

Figure 1:
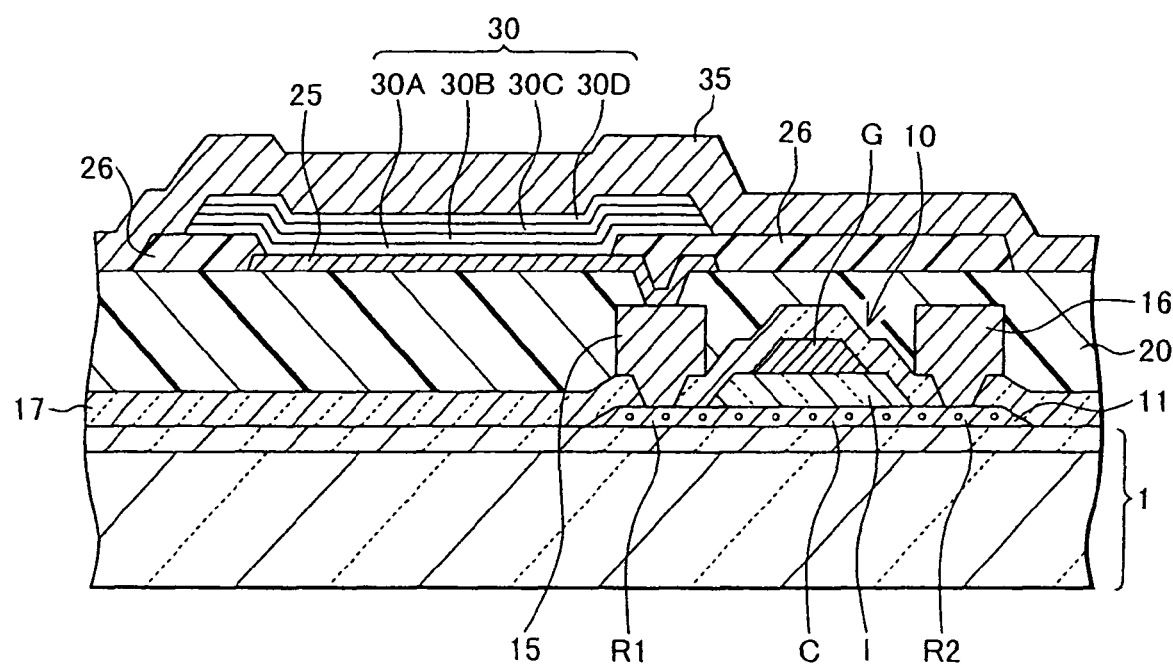
FIG. 1 is a cross sectional view of an organic EL device according to a first embodiment.
Figure 2:
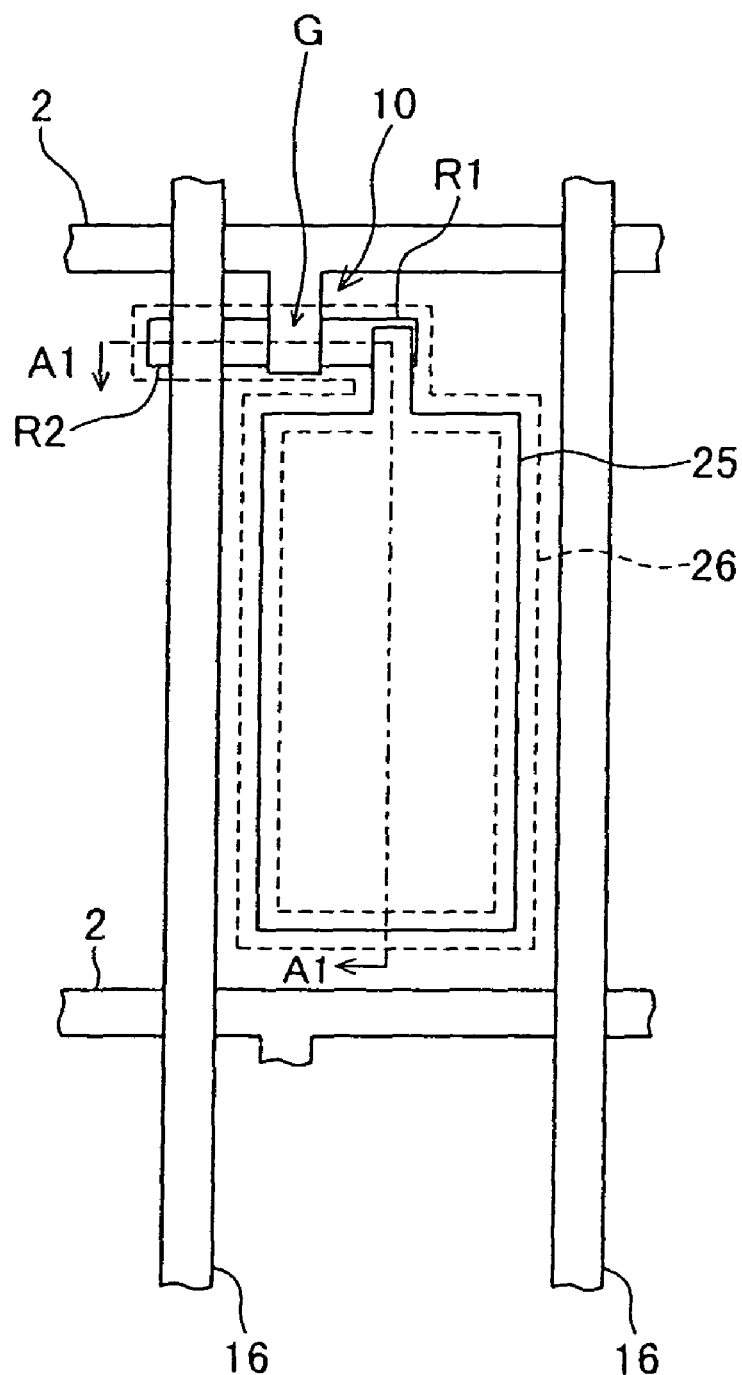
FIG. 2 is a plan view of the organic EL device of the first embodiment.

FIG. 1 is a cross sectional view of an organic EL device of the first embodiment, and FIG. 2 is a plan view of one pixel.

As shown in FIG. 2, disposed on a substrate are a plurality of gate lines 2 extending in a row direction and a plurality of data lines 16 extending in a column direction. The gate line 2 and data line 16 are electrically insulated by an insulating film at an intersection therebetween.

A TFT 10 is disposed at each intersection between the gate line 2 and data line 16. TFT 10 comprises first and second regions R1 and R2 as a source and a drain, and a gate electrode G. The gate electrode G is connected to a corresponding gate line 2. The second region R2 is connected to a corresponding data line 16.

A pixel electrode 25 is disposed in an area surrounded by two adjacent gate lines 2 and two adjacent data lines 16. The pixel electrode 25 is connected to the first region R1 of a corresponding TFT 10. A cover film 26 is disposed overlapping the outer periphery of the pixel electrode 25 and covering the edge of the pixel electrode and an area having some width outside the outer periphery of the pixel electrode. The cover film 26 covers the area superposing TFT 10, as viewed along a direction parallel to the normal direction of the substrate. The inner area other than the edge of the pixel electrode 25 is not covered with the cover film 26.

FIG. 1 is the cross sectional view taken along one-dot chain line A1-A1 shown in FIG. 2. TFT 10 is formed on a silicon oxide film formed on a principal surface of the substrate. TFT 10 comprises a polysilicon film 11 formed on the surface of the substrate 1, a gate insulating film I of silicon oxide formed on the polysilicon film, and the gate electrode G of AlNd alloy formed on the gate insulating film. A channel region C is defined in the polysilicon film 11 in a region under the gate electrode G, and n-type first and second regions R1 and R2 as a source and a drain are defined on both sides of the channel region. A thickness of the polysilicon film 11 is 20 to 100 nm, a thickness of the gate insulating film I is 100 to 150 nm, and a thickness of the gate electrode G is 300 to 400 nm.

An insulating film 17 having a thickness of 300 to 500 nm is formed on the substrate 1, covering TFT 10. The insulating film 17 is a single layer of silicon oxide or a multilayer of silicon oxide and silicon nitride. Via holes are formed through the insulating film 17 at positions corresponding to the first and second regions R1 and R2 of TFT 10. The data line 16 is formed on the insulating film 17. The data line is made of a single layer of molybdenum (Mo) or a multilayer of titanium (Ti)/aluminum (Al)/molybdenum (Mo). The data line 16 is connected to the second region R2 of TFT 10 via the via hole formed through the insulating film 17.

An intermediate connection metal 15 is formed on the surface of the insulating film 17 in an area corresponding to the first region R1 of TFT 10. The intermediate connection metal is made of a single layer of molybdenum (Mo) or a multilayer of titanium (Ti)/aluminum (Al)/molybdenum (Mo). The intermediate connection metal 15 is connected to the first region via the via hole formed through the insulating film 17.

An interlayer insulating film 20 is formed on the insulating film 17, covering the data line 16 and intermediate connection metal 15. The interlayer insulating film 20 is made of photosensitive resin (e.g., acrylic resin) and its thickness is 3.0 µm. The interlayer insulating film 20 has a planarized surface.

A via hole is formed in the interlayer insulating film 20, exposing the upper surface of the intermediate connection metal 15. A pixel electrode 25 of ITO is formed on the surface of the interlayer insulating film 20. The pixel electrode 25 is connected to the intermediate connection member 15 via the via hole in the interlayer insulating film 20. The pixel electrode 25 can therefore be electrically connected to the first region R1 of TFT 10 via the intermediate connection metal 15.

The cover film 26 disposed along the outer periphery of the pixel electrode 25 covers the edge of the pixel electrode 25 and the upper surface of the interlayer insulating film 20 in an area above TFT 10. The cover film 26 is made of photosensitive resist material, e.g., novolak series resist material. An organic light emission layer 30 is formed on the surface of the pixel electrode 25. For example, the organic light emission layer 30 has a four-layer structure of a hole injection layer 30A, a hole transport layer 30B, a light emission layer 30C and an electron transport layer 30D stacked in this order from the pixel electrode 25 side. The edge of the organic light emission layer 30 extends to an upper surface portion of the cover film 26.

An upper electrode 35 covers the organic light emission layer 30 and cover film 26. The upper electrode 35 is made of aluminum and its thickness is 100 to 200 nm. Voltage is applied across the pixel electrode 25 and upper electrode 35, by using the pixel electrode 25 as an anode and the upper electrode 35 as a cathode. The cover film 26 prevents a short circuit between the pixel electrode 25 and upper electrode 35. As current is injected into the organic light emission layer 30, light is emitted. This light is radiated to the external through the substrate 1.

Next, with reference to FIGS. 3A and 3B, description will be made on a manufacture method for the organic EL device of the first embodiment.

Figure 3A:
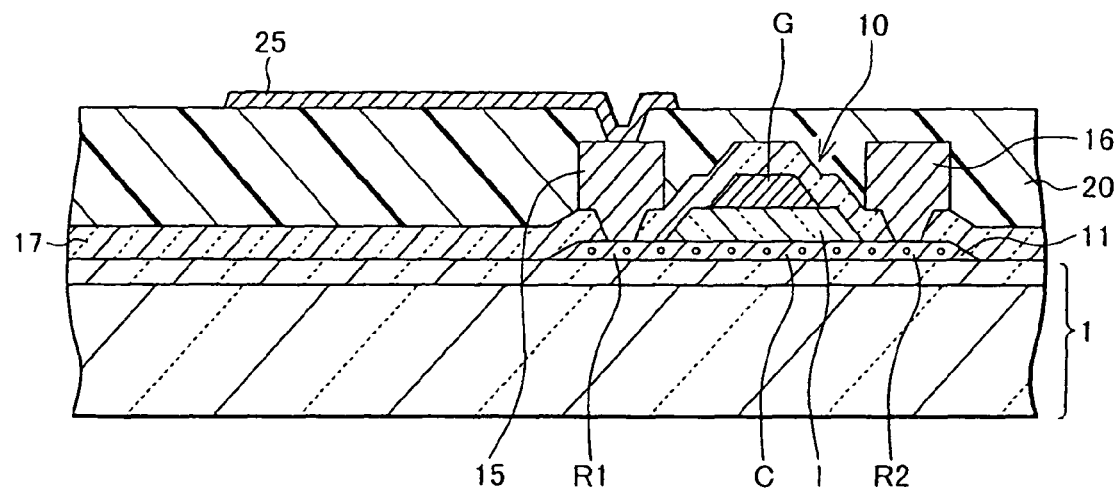
FIGS. 3A and 3B are cross sectional views of a substrate illustrating an organic EL device manufacture method according to the first embodiment.

As shown in FIG. 3A, on the surface of a glass substrate such as #1737 of Corning Limited, a silicon nitride film is deposited to a thickness of 50 nm by plasma enhanced chemical vapor deposition (PECVD) to form a substrate 1. On the silicon nitride film, a silicon oxide film is deposited to a thickness of about 150 to 300 nm by PECVD. On the silicon oxide film, an amorphous silicon film is deposited by PECVD.

Heat treatment is performed at a temperature of 450° C. for one hour in a nitrogen atmosphere to degas hydrogen in the amorphous silicon film. The amorphous silicon film is polycrystallized by irradiating an excimer laser beam having a wavelength of 308 nm. A pulse energy density of the radiated excimer laser beam is 300 to 400 mJ/cm$^2$. With this laser radiation, a polysilicon film 11 is formed. The polysilicon film 11 is partially etched by reactive ion etching to leave the polysilicon film 11 in an area where TFT is to be formed.

A silicon oxide film of 100 to 150 nm in thickness is formed covering the polysilicon film 11, by PECVD. On the silicon oxide film, an AlNd alloy film having a thickness of 300 to 400 nm is formed by sputtering.

By covering the surface of the AlNd alloy film with a resist pattern, the AlNd alloy film is wet-etched. By leaving the resist pattern, the silicon oxide film under the AlNd alloy film is dry-etched by using $CHF_3$. By leaving the resist pattern, the AlNd alloy film is laterally etched to shrink the AlNd alloy film. In this manner, a gate insulating film I of silicon oxide and a gate electrode G of AlNd alloy are formed. After the AlNd alloy film is side-etched, the resist pattern is removed.

By using a ion doping system, $P^+$ ions are doped in $PH_3$ diluted gas of 1 to 5%. In this case, first doping is performed under the conditions of an acceleration energy of 10 keV and a dose of $5 \times 10^{14}$ to $1 \times 10^{15}$ cm$^{-2}$, and second doping is performed under the conditions of an acceleration energy of 70 keV and a dose of $5 \times 10^{12}$ to $5 \times 10^{13}$ cm$^{-2}$. An n-channel TFT of a lightly doped drain structure (LDD structure) is therefore formed.

An insulating film 17 is formed on the substrate 1 by PECVD, covering TFT 10. The insulating film is a multilayer of a silicon oxide film of 50 nm in thickness and a silicon nitride film of 350 nm in thickness. Via holes are formed through the insulating film 17 at necessary positions. An intermediate connection metal 15 and a data line 16 are formed by patterning a multilayer film of a titanium layer of 30 nm in thickness, an aluminum layer of 300 nm in thickness and a molybdenum layer of 50 nm in thickness. An interlayer insulating film 20 of photosensitive resin (e.g., acrylic resin) is formed by spin coating, covering the intermediate connection metal 15 and data line 16. A via hole is formed in the interlayer insulating film 20 to expose the upper surface of the intermediate connection metal 15.

An ITO film is deposited by sputtering and patterned to form a pixel electrode 25. The pixel electrode 25 is connected to the intermediate connection metal 15 via the via hole formed in the interlayer insulating film 20.

Figure 3B:
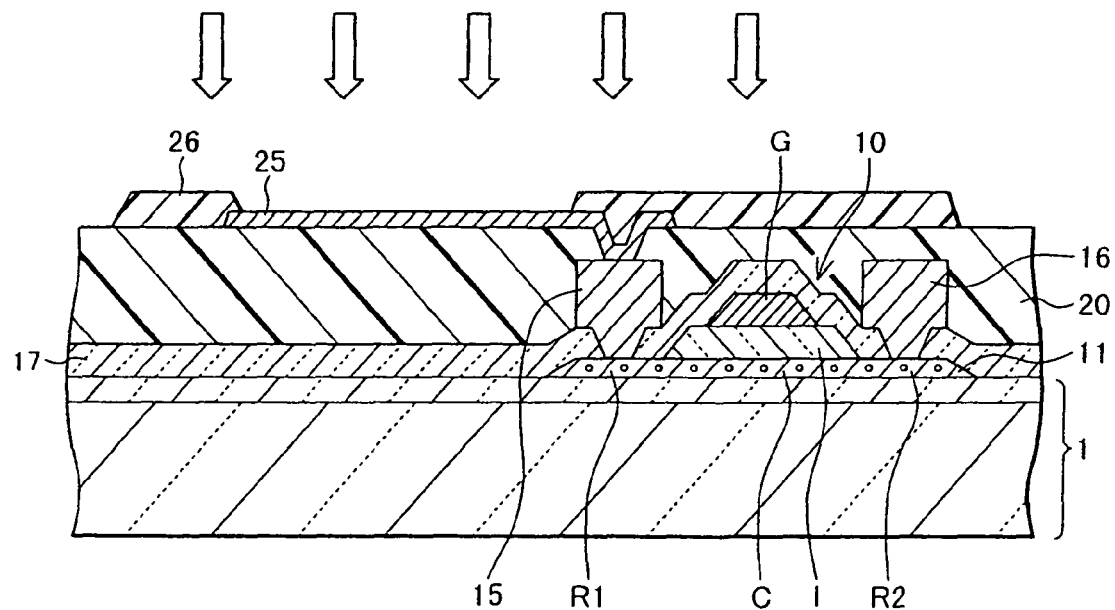

As shown in FIG. 3B, a cover film 26 is formed by coating photosensitive resist, exposing and developing it. The cover film 26 is superposed on the outer periphery of the pixel electrode 25 and TFT 10, as viewed along a line of view parallel to the normal of the substrate 1.

The substrate is placed in an ozone atmosphere and an ultraviolet ray is irradiated to the substrate surface on the side where the pixel electrode 25 is formed, by using a low pressure mercury lamp. A main wavelength of the radiated ultraviolet ray is 254 nm. An intensity of the ultraviolet ray at the substrate surface is about 6.7 mW/cm$^2$ and a radiation time is 20 minutes.

As shown in FIG. 1, an organic light emission layer 30 is formed on the pixel electrode 25 by vacuum vapor deposition using a shadow mask. The organic light emission layer 30 is made of a hole injection layer 30A, a hole transport layer 30B, a light emission layer 30C and an electron transport layer 30D. An upper electrode 35 of aluminum is formed by vacuum vapor deposition.

The characteristics of the organic light emission layer 30 can be improved by irradiating an ultraviolet ray to the surface of the pixel electrode 25 of ITO in an ozone atmosphere, prior to depositing the organic light emission layer 30. Similar advantages are expected for the case that the pixel electrode 25 is formed by using transparent conductive material which contains indium.

In the above-described first embodiment, during the ultraviolet radiation shown in FIG. 3B, the intensity of the ultraviolet ray reaching TFT 10 is weakened because the cover film 26 shields the ultraviolet ray. It is therefore possible to prevent the characteristics of TFT 10 from being degraded by ultraviolet radiation. The characteristics of TFT 10 can be prevented from being degraded if the cover film 26 is disposed so as to be superposed at least upon the channel region C of TFT 10.

Figure 4A:
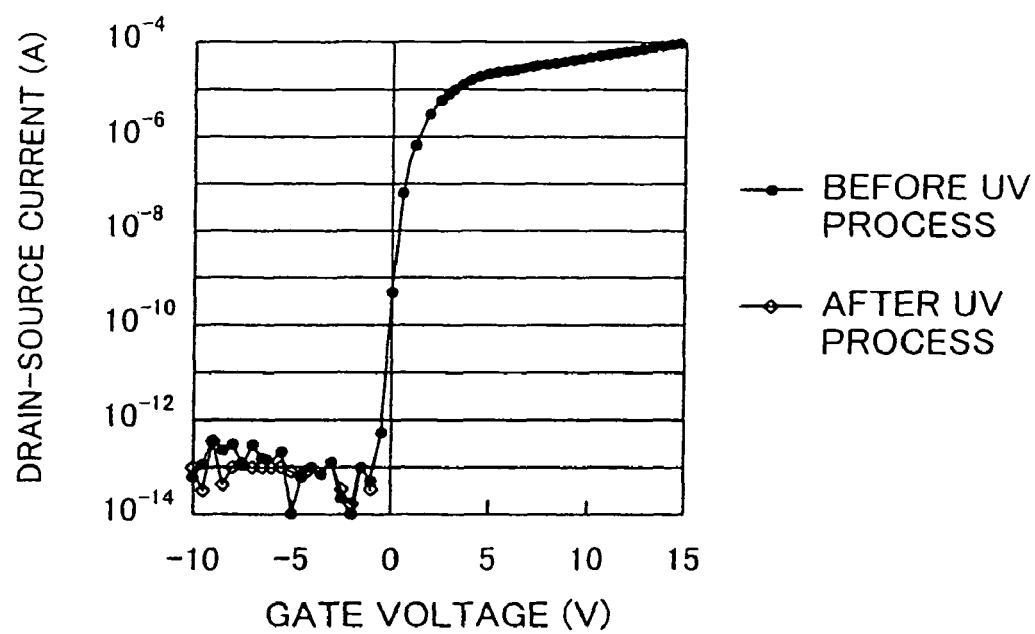
FIG. 4A is a graph showing the characteristics of TFT of the organic EL device of the first embodiment, before and after ultraviolet radiation.
Figure 4B:
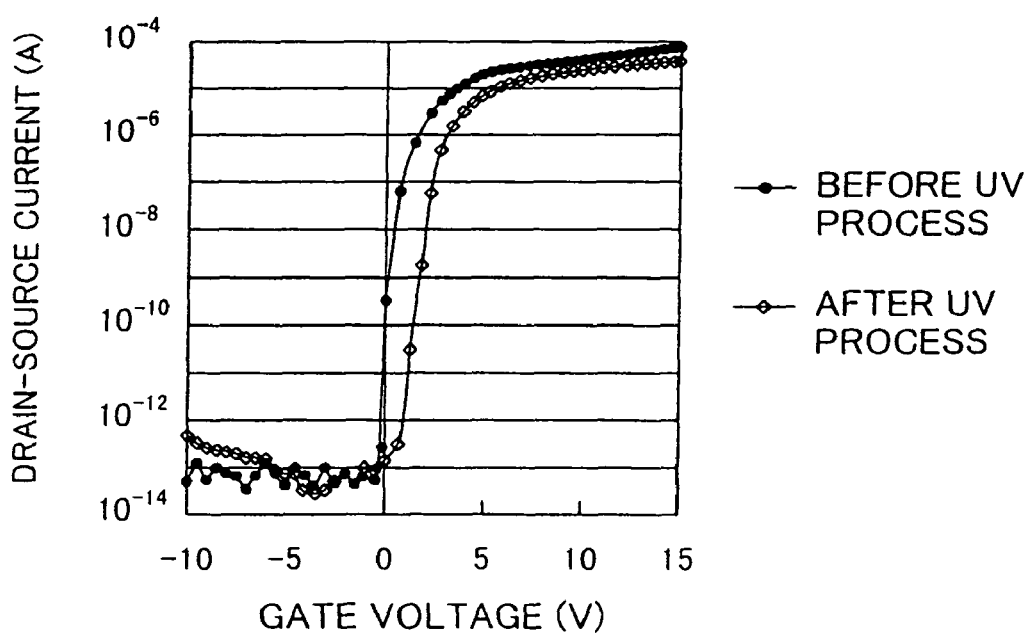
FIG. 4B is a graph showing the characteristics of TFT of a conventional organic EL device, before and after ultraviolet radiation.

FIG. 4A shows the relation between a gate voltage and a source-drain current of TFT 10. The abscissa represents a gate voltage in the unit of "V" and the ordinate represents a source-drain current in the unit of "A". A black circle in FIG. 4A indicates the characteristics before ultraviolet radiation and a white circle indicates the characteristics after ultraviolet radiation. For the purposes of comparison, the characteristics of TFT are shown in FIG. 4B when ultraviolet radiation is performed without light shielding by the cover film 26. A black circle in FIG. 4B indicates the characteristics before ultraviolet radiation and a white circle indicates the characteristics after ultraviolet radiation.

If TFT is not shielded with the cover film, it can be seen from FIG. 4B that the threshold value drifts and an on-current lowers, due to ultraviolet radiation. In contrast, as in the first embodiment, since an ultraviolet ray incident upon TFT 10 is shielded with the cover film 26, a threshold value drift and a lowered on-current are not observed.

In order to obtain sufficient effects of preventing the characteristics of TFT 10 from being degraded, it is preferable to set an ultraviolet transmissivity of the cover film 26 to 30% or lower. For example, if a low pressure mercury lamp is used as an ultraviolet source, it is preferable to set the transmissivity of the cover film to 30% or lower at a wavelength of 254 nm.

In the first embodiment, although the ultraviolet radiation is performed in the ozone atmosphere, it may be performed in an oxidizing atmosphere other than ozone.

Figure 5:
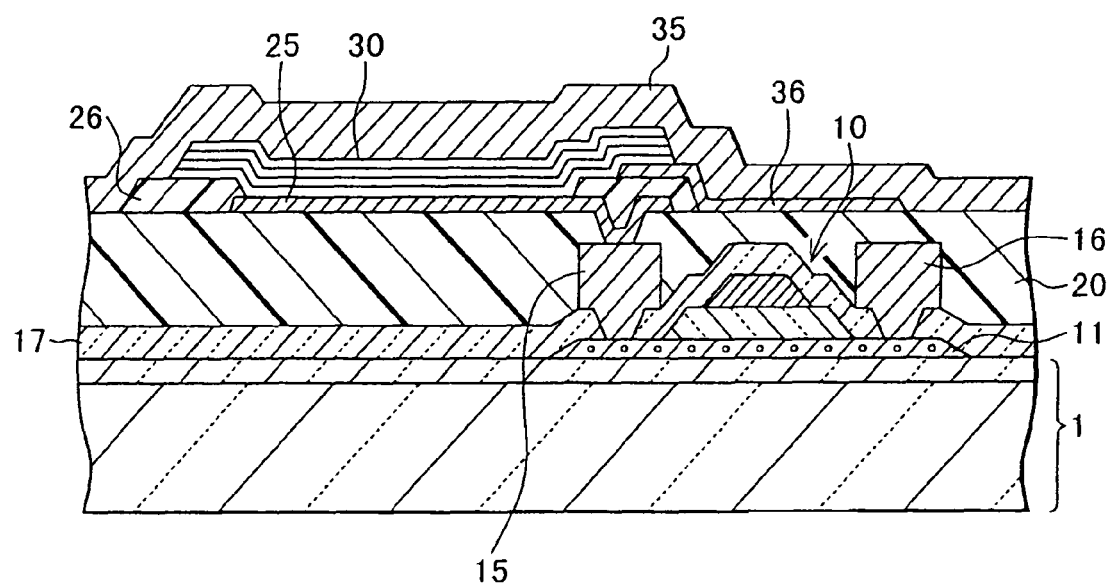
FIG. 5 is a cross sectional view of the organic EL device of the second embodiment.
Figure 6:
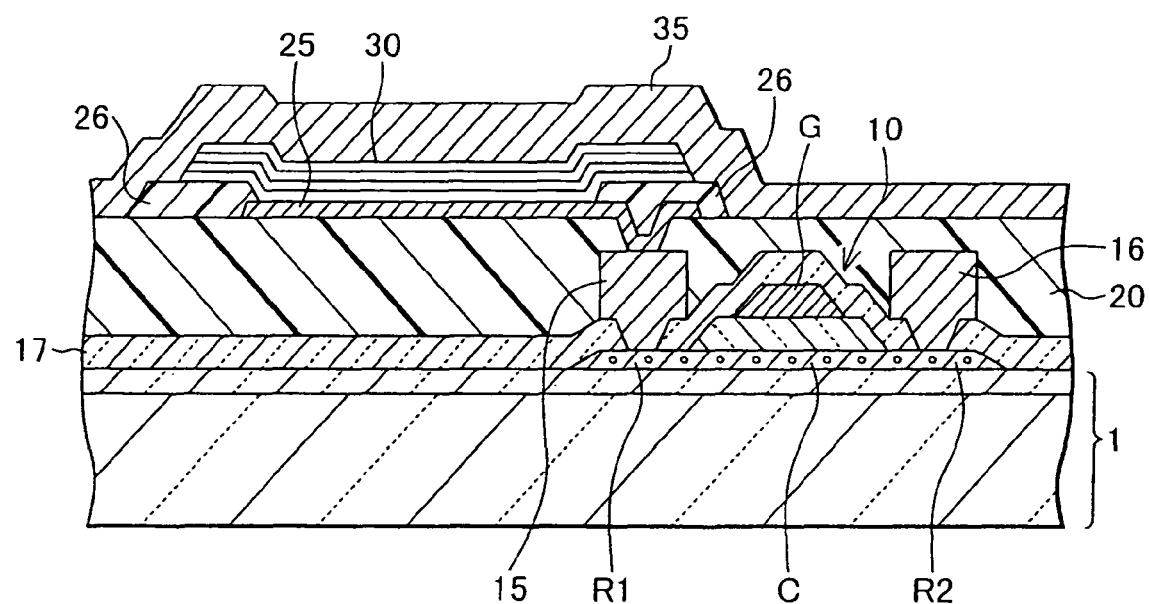
FIG. 6 is a cross sectional view of a conventional organic EL device.

FIG. 5 is a cross sectional view of an organic EL device according to the second embodiment. In the first embodiment, the cover film 26 covering the edge of the pixel electrode 25 is extended to the area above TFT 10 and a portion of the cover film 26 is used as a light shielding film. In the second embodiment, a cover film 26 only covers the edge of a pixel electrode 25 and is not extended to the area above TFT 10. Instead, the area above TFT 10 is covered with a light shielding film 36 made of metal, e.g., aluminum. For example, the light shielding film 36 can be formed by lift-off.

In the second embodiment, although a new process of forming the light shielding film 36 is necessary as opposed to the first embodiment, the transmissivity of an ultraviolet ray can be lowered further by forming the light shielding film 36 by using metal more likely to shield an ultraviolet ray.

The present invention has been described in connection with the preferred embodiments. The invention is not limited only to the above embodiments. For example, it will be apparent to those skilled in the art that other various modifications, improvements, combinations, and the like can be made.

I claim:

1. A manufacture method for an organic EL device comprising steps of:

forming a thin film transistor on a principal surface of a substrate, the thin film transistor including first and second regions as a source and a drain, a channel region between the first and second regions and a gate electrode;

forming an interlayer insulating film over the substrate, the interlayer insulating film covering the thin film transistor;

forming a pixel electrode disposed on the interlayer insulating film, the pixel electrode being electrically connected to the first region of the thin film transistor;

forming a cover film disposed so as to overlap an entire outer periphery of the pixel electrode and covering an edge of the pixel electrode and an area having some width outside the outer periphery of the pixel electrode, exposing an inner area of a surface of the pixel electrode, the inner area other than the edge of the pixel electrode is not covered with the cover film, and covering a surface of the interlayer insulating film in an area superposed upon the channel region of the thin film transistor;

wherein the cover film has a transmissivity to ultraviolet rays of 30% or lower;

irradiating an ultraviolet ray upon the substrate from a principal surface side of the substrate, while a surface of the pixel electrode is exposed to an oxidizing atmosphere;

forming an organic light emission layer on the pixel electrode, the organic light emission layer containing organic light emission material; and forming an upper electrode on the organic light emission layer.

2. A manufacture method for an organic EL device according to claim 1, wherein the step of forming the cover film comprises steps of:

forming a resist film by coating photosensitive resist on a surface of the interlayer insulating film; and partially exposing and developing the resist film to form the cover film made of the remaining resist film.

3. A manufacture method for an organic EL device according to claim 2, wherein the pixel electrode is made of transparent conductive material which contains indium.

4. A manufacture method for an organic EL device according to claim 1, wherein the pixel electrode is made of transparent conductive material which contains indium.

* * * * *